United States Patent [19]

Fardad et al.

[11] Patent Number: 6,054,253
[45] Date of Patent: *Apr. 25, 2000

[54] SOLVENT-ASSISTED LITHOGRAPHIC PROCESS USING PHOTOSENSITIVE SOL-GEL DERIVED GLASS FOR DEPOSITING RIDGE WAVEGUIDES ON SILICON

[75] Inventors: M. Amir Fardad, Montreal; S. Iraj Najafi, Westmount; Mark P. Andrews, Montreal, all of Canada

[73] Assignee: McGill University-The Royal Institute for the Advancement of Learning, Quebec, Canada

[ * ] Notice: This patent issued on a continued prosecution application filed under 37 CFR 1.53(d), and is subject to the twenty year patent term provisions of 35 U.S.C. 154(a)(2).

[21] Appl. No.: 08/948,511

[22] Filed: Oct. 10, 1997

[51] Int. Cl.$^7$ .................................. G03F 7/00; G02B 6/10

[52] U.S. Cl. ........................... 430/321; 430/330; 385/131

[58] Field of Search .................................. 430/320, 321, 430/330, 322; 385/131, 146

[56] References Cited

U.S. PATENT DOCUMENTS

| | | | |
|---|---|---|---|
| 5,054,872 | 10/1991 | Fan et al. | 385/130 |
| 5,120,811 | 6/1992 | Glotfelter et al. | 528/25 |
| 5,265,185 | 11/1993 | Ashley | 385/132 |
| 5,620,495 | 4/1997 | Aspell et al. | 430/321 |

OTHER PUBLICATIONS

Najafi et al. "UV–light imprinted surface, ridge and buried sol–gel glass waveguide devices on silicon." Proc. SPIE–Int. Soc. Opt. Eng, vol. 2954, pp. 100–104, 1996.

Holmes et al. "Fabrication of low–loss channel waveguides in sol–gel glass on silicon substrates" Adv. Sci. Techno., pp. 73–80, 1995.

Fabrication of Buried Channel Waveguides On Silicon Substrates Using Spin–On Glass, A.S. Holmes, R.R.A. Syms, Ming Li, and Mino Green Applied Optics, vol. 32, No. 25, Sep. 1, 1993, 4916–4921.

Silica Waveguides On Silicon and Their Application To Integrated–Optic Components, Masao Kawachi, Optical and Quantum Electronics 22 (1990), 391–416.

Advances In Integrated Optics, Chapter 7, Silica–On Silicon Integrated Optics, R.R.A. Syms, 121–150.

Nonlinear Absorption and Refraction of Quantum Confined InP Nanocrystals Growth In Porous Glass, M. D. Dvorak, B. L.. Justus, D. K. Gaskill amd D. G. Hendershot, Appl.Phys-.Lett. 66(7), Feb. 13, 1995, 804–806.

Sol–Gel Synthesis Of Rare–Earth–Doped Fluoride Glass Thin Films, John Ballato, Matthew Dejneka, Richard E.Riman, Elias Snitzer, and Weimin Zhou, J. Mater.Res., vol. 11, No. 4, Apr. 1996, 841–849.

(List continued on next page.)

Primary Examiner—Kathleen Duda
Attorney, Agent, or Firm—Dvorak & Orum

[57] ABSTRACT

The process for fabricating a ridge waveguide on a substrate uses a photosensitive sol-gel glass material prepared, according to a first embodiment, by mixing methacryloxypropyltrimethoxysilane ($H_2C=C(CH_3)CO_2(CH_2)_3Si(OCH_3)_3$) and methacrylic acid ($H_2C=C(CH_3)COOH$) or, according to a second embodiment, by mixing methacryloxypropyltrimethoxysilane ($H_2C=C(CH_3)CO_2(CH_2)_3Si(OCH_3)_3$) with bis(s-butoxy)aluminoxytriethoxysilane. A thick film of photosensitive sol-gel glass material is first dip coated on at least a portion of the substrate. A photomask is applied to the film of photosensitive sol-gel glass material, and this sol-gel material is exposed to ultraviolet radiation through the opening(s) of the photomask to render a portion of the film insoluble to a given solvent and thereby imprint the ridge waveguide in that film. The thick film is then soaked in this solvent, for example n-propanol to dissolve the unexposed portion of the sol-gel film and leave on the substrate the exposed film portion and therefore the ridge waveguide. The ridge waveguide is heat cured and the heat cured ridge waveguide is covered with a cladding layer.

17 Claims, 9 Drawing Sheets

OTHER PUBLICATIONS

Fabricaton and Characterization Of Low–Loss, Sol–Gel Planar Waveguides, Lin Yang, S. Scott Saavedra, Neal R. Armstrong, and John Hayes, Analytical Chemistry, vol. 66, No. 8, Apr. 15, 1994, 1254–1263.

Thin Films, the Chemical Processing Up To Gelatin, Helmut Schmidt, Structure and Bonding, vol. 77, Springer–Verlag Berlin Heidelberg 1992, 119–151.

Gratings Fabrication By Ultraviolet Light Imprinting and Embossing in a Sol–Gel Silica Glass, J. E. Chisham, M.P. Andrews, C–Y Li, S. I. Najafi, and A. Malek–Tabrizi, SPIE vol. 2695, 52–56.

Direct UV Writing Of Buried Singlemode Channel Waveguides In Ge–Doped Silica Films, M. Svalgaard, C. V. Poulsen, A. Bjarklev and O. Poulsen, Electronics Letters, Aug. 18, 1994, vol. 30, No. 17, 1401–1403.

Auto–Embossed Bragg Gratings From Self–Organizing Polymers; Channel Tuning of Periodicity and Photoinduced Anisotropy, Mark. P. Andrews, Tanya Kanigan and S. Iraj Najafi, SPIE vol. 2695, 4–15.

Ultraviolet Light Imprinted Sol–Gel Silica Glass Channel Waveguides On Silicon, S. I. Najafi, C.–Y. Li, J. Chrisham, M.P. Andrews, P. Coudray, A. Malek–Tabrizi, and N. Peyghambarian, SPIE vol. 2695, 38–41.

Sol–Gel Science, The Physics and Chemistry of Sol–Gel Processing, C. Jeffrey Brinker, George W. Scherer, Academic Press, Inc., 864–879.

Effects of $H_2O$ Structure Of Acid–Catalysed $SiO_2$ Sol–Gel Films, M.A. Fardad, E. M. Yeatman, E. J. C. Dawnay, Mino Green, F. Horowitz, Journal Of Non–Crystalline Solids 183 (1995), 260–267.

Low–Loss Achieved In Sol–Gel Based Silica–On–Silicon Integrated Optics Using Borophosphosilicate Glass, R. R. A. Syms, V. Scheider, W. Huang and A. S. Holmes, Electronics Letters, Oct. 12, 1995, vol. 31, No. 21, 1883–1834.

Loss Characteristics Of Potassium and Silver Double–Ion–Exchanged Glass Waveguides, W.J. Wang, S. Honkanen, S. I. Najafi, and A. Tervonen, J.Appl.Phys., vol. 74, No. 3, Aug. 1, 1993, 1529–1533.

Sol–Gel Integrated and Optical Coupler By Ultraviolet Light Imprinting, C.–Y. Li, J. Chisham, M. Andrews, S. I. Najafi, J. D. Mackenzie and N. Peyghambartan, IEE 1995, Dec. 1, 1994.

SOLVENT-ASSISTED LITHOGRAPHIC PROCESS USING PHOTOSENSITIVE SOL-GEL DERIVED GLASS FOR DEPOSITING RIDGE WAVEGUIDES ON SILICON

BACKGROUND OF THE INVENTION

1. Field of the Invention

The present invention relates to a solvent-assisted lithographic process for depositing ridge waveguides on substrates utilizing simple photomask technology and photosensitive sol-gel wave-propagating material.

In the present disclosure and the appended claims, the term "ridge waveguides" is intended to designate not only ridge waveguides but other devices such as splitters and directional couplers made of ridge waveguides.

2. Brief Description of the Prior Art

Ridge waveguides are basic building block structures for integrated optic devices and components. Ridge waveguides are conventionally fabricated out of glass by multi-step combinations of lithographic photomask technologies and etching processes which utilize equipments, for example reactive ion etchers, requiring a substantial capital investment and infrastructure. Moreover, ridge waveguides structures are fabricated from glass that must match the refractive index and other characteristics of optical fibers to be attractive to the photonics industry.

The prior art technologies for fabricating glass integrated optic devices and components comprise:

- sputtering;
- thermal oxidation;
- chemical vapor deposition;
- plasma enhanced chemical vapor deposition;
- flame hydrolytic deposition; and
- sol-gel deposition.

Only chemical vapor deposition, plasma enhanced chemical vapor deposition, flame hydrolytic deposition, and sol-gel deposition are currently employed. These different technologies have been discussed by Andrews, "*An overview of sol-gel guest-host materials chemistry for optical devices*", Proc. SPIE Soc. Opt. Eng. Integrated Optics devices: Potential for Commercialization, Vol. 2997, pp. 48–59 (1997).

Many of the above listed prior art technologies involve a high temperature (>1000° C.) glass processing incompatible with hybrid optoelectronic silicon and GaAs benches.

Regarding low temperature plasma enhanced chemical vapor deposition, this technology must entail complex multistep mask processes including reactive ion etching.

Conventional sol-gel derived glass technologies require post-film deposition thermal treatment including rapid thermal annealing at temperatures approaching or exceeding 1000° C. Reactive ion etching and multistep mask technologies are required to complete the fabrication of the integrated optic device.

OBJECTS OF THE INVENTION

An object of the present invention is therefore to overcome the above discussed drawbacks of the prior art.

Another object of the invention is to provide a process for fabricating ridge waveguides in large numbers, in a simplified manner and at temperatures that are compatible with on-silicon technology and processes, and in an economically competitive manner compared with presently available processes such as those involving reactive ion etching in combination with rapid thermal annealing.

A further object of the present invention is to provide a process for fabricating ridge waveguides from sol-gel glass materials for optic and integrated optic devices and components that is greatly simplified in terms of the number of processing steps, and that uses a conventional photomask technology requiring no large capital investment in equipment.

SUMMARY OF THE INVENTION

More specifically, in accordance with the present invention, there is provided a process for fabricating a ridge waveguide on a substrate, comprising the steps of producing a film of photosensitive sol-gel wave-propagating material on at least a portion of the substrate, applying a photomask to the film of photosensitive sol-gel wave-propagating material, this photomask having at least one opening outlining the ridge waveguide, exposing the photosensitive sol-gel wave-propagating material to ultraviolet radiation through the at least one opening of the photomask to render a portion of the film insoluble to a given solvent and thereby imprint the ridge waveguide in that film, and dissolving the unexposed portion of the film of photosensitive sol-gel wave-propagating material by means of the given solvent to leave on the substrate the exposed film portion and therefore the ridge waveguide.

The process according to the invention may further comprise the steps of heat curing the ridge waveguide, and covering the heat cured ridge waveguide with a cladding layer.

The process in accordance with the present invention may further comprise, prior to the film producing step, a step of preparing a photosensitive sol-gel glass material constituting the photosensitive sol-gel wave-propagating material. The step of preparing a photosensitive sol-gel glass material comprises, in accordance with a first preferred embodiment, mixing methacryloxypropyltrimethoxysilane ($H_2C=C(CH_3)CO_2(CH_2)_3Si(OCH_3)_3$) with methacrylic acid ($H_2C=C(CH_3)COOH$) or, in accordance with a second preferred embodiment, mixing methacryloxypropyltrimethoxysilane ($H_2C=C(CH_3)CO_2(CH_2)_3Si(OCH_3)_3$) with bis(s-butoxy)aluminoxytriethoxysilane.

In accordance with the above first preferred embodiment, the substrate is a silicon substrate, and the step of preparing the photosensitive sol-gel glass material comprises:

- mixing methacryloxypropyltrimethoxysilane ($H_2C=C(CH_3)CO_2(CH_2)_3Si(OCH_3)_3$) with 0.01M HCl in a molar ratio of 1:0.75 to produce a first mixture;
- mixing zirconium(IV)-n-propoxide ($Zr(OC_3H_7)_4$), referred to in the present disclosure and in the appended claims to as $Zr(OPr)_4$, with n-propanol in a volume ratio of 1:1 to produce a second mixture, and adding to this second mixture 1 mole of methacrylic acid ($H_2C=C(CH_3)COOH$) by mole of $Zr(OPr)_4$ to produce a third mixture;
- mixing the first and third mixtures to produce a fourth mixture containing methacryloxypropyltrimethoxysilane ($H_2C=C(CH_3)CO_2(CH_2)_3Si(OCH_3)_3$) and $Zr(OPr)_4$ in a molar ratio of 4:1;
- mixing the fourth mixture and deionized water ($H_2O$) to obtain a fifth mixture in which the molar ratio of deionised water ($H_2O$) to Si and Zr alkoxides is 1.5;
- mixing the fifth mixture with 1-hydroxycyclohexylphenylketone ($C_6H_5COC_6H_{10}OH$) to produce a sixth mixture containing Si/Zr alkoxides and 1-hydroxycyclohexylphenylketone ($C_6H_5COC_6H_{10}OH$) in a molar ratio of 49:1, this sixth mixture constituting the photosensitive sol-gel glass material; and filtering the sixth mixture to obtain a filtered photosensitive sol-gel glass material.

According to the first preferred embodiment, the step of preparing a photosensitive sol-gel glass material comprises adding zirconium(IV)-n-propoxide ($Zr(OC_3H_7)_4$) as a refractive index modifier in the sixth mixture.

In accordance with other preferred embodiments:

the film producing step comprises dip coating a thick film of photosensitive sol-gel glass material on the substrate and pre-baking the dip coated thick film;

the exposing step comprises exposing the photosensitive sol-gel glass material through the opening of the photomask to an ultraviolet light at a wavelength $\lambda \leq 350$ nm and an intensity $\approx 14$ W cm$^{-2}$;

the dissolving step comprises soaking the film of photosensitive sol-gel glass material in n-propanol;

the step of heat curing the ridge waveguide comprises post-baking the ridge waveguide at a temperature $\leq 200°$ C.; and the step of covering the heat cured ridge waveguide with a cladding layer comprises:

dip coating a layer of sol-gel glass material over the ridge waveguide;

heat curing the layer of sol-gel glass material at a temperature $\leq 200°$ C.; and synthesizing the sol-gel glass material by mixing methyltrimethoxysilane ($CH_3Si(OCH_3)_3$) and tetraethoxysilane ($Si(OC_2H_5)_4$) in a molar ratio of 3:2.

The objects, advantages and other features of the present invention will become more apparent upon reading of the following non restrictive description of a preferred embodiment thereof, given by way of example only with reference to the accompanying drawings.

BRIEF DESCRIPTION OF THE DRAWINGS

In the appended drawings:

FIGS. 6c and 6d are measured mode profiles of a 5×3 μm buried UV imprinted ridge waveguide at $\lambda$=1.55 μm, with their corresponding model field intensity distributions; simulated mode profile intensity was obtained by finite difference method and normalized contours of intensity 0.2, 0.4 and 0.8 are indicated;

DETAILED DESCRIPTION OF THE PREFERRED EMBODIMENTS

The preferred embodiments of the present invention, as presented in the following description, are concerned with the deposition of ridge waveguides, passive or not, on silicon (semiconductor) by a solvent-assisted lithographic deposition process utilizing simple photomask technology and photosensitive sol-gel derived glasses. In summary, the deposition process comprises the following steps:

a thick film ($\approx 4$ μm thick) of photosensitive sol-gel derived glass is first dip coated on a silicon substrate in one step;

the channel waveguides and power splitters are imprinted by exposing the thick film to ultraviolet (UV) light through an appropriate photomask;

the unexposed regions of the thick film of sol-gel derived glass are removed by soaking the thick film in a solvent such as n-propanol; and the remaining ridges are then heat cured at a temperature $\leq 200°$ C. and planarized with a sol-gel cladding layer.

This deposition procedure is simple and fully reproducible, and leads to ridge waveguides with low loss of the order of 0.13 dB/cm.

Circular mode profiles have been observed from the fabricated ridge waveguides covered with a cladding.

In the following description, the fabricated ridge waveguides are characterized with scanning electron microscopy (SEM), atomic force microscopy (AFM), surface profilometry, ellipsometry, and fiber end-coupling.

Although the preferred embodiments of the present invention will be described with reference to deposition of ridge waveguides on a silicon substrate, it should be kept in mind that the ridge waveguides can be deposited on substrated made of other materials, semiconductor or not, as long as sufficient adhesion of the sol-gel derived glass to the material of the substrate is obtained.

EXAMPLE 1

Figure 1:
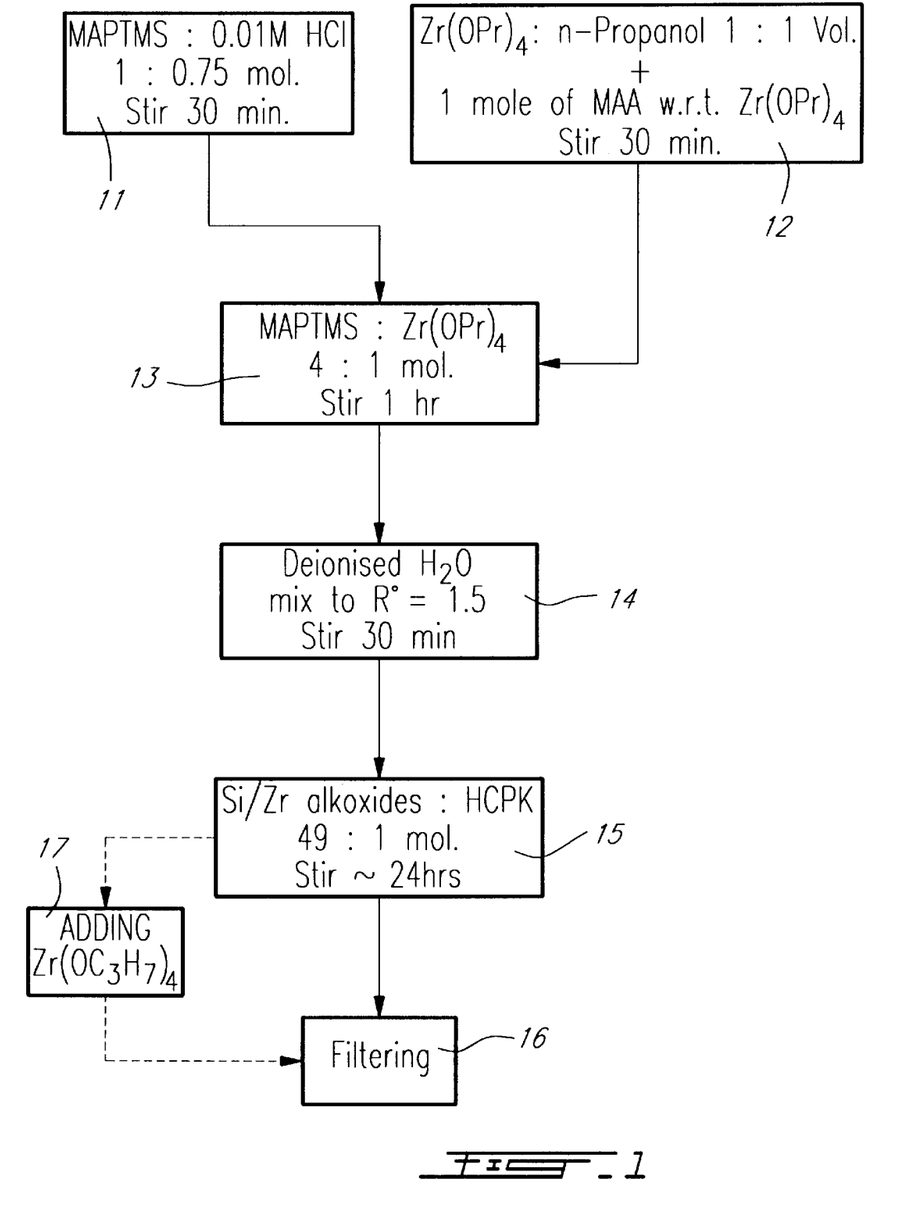
FIG. 1 is a flow chart depicting the various steps conducted to produce a photosensitive sol-gel glass material usable by the process according to the invention to fabricate a ridge waveguide.

FIG. 1 depicts a process of sol-gel production according to Example 1.

In step 11, methacryloxypropyltrimethoxysilane ($H_2C=C(CH_3)CO_2(CH_2)_3Si(OCH_3)_3$), hereinafter referred to as MAPTMS, is mixed with 0.01M HCl in a molar ratio of 1:0.75. The resulting mixture is stirred for 30 minutes.

In step 12, $Zr(OPr)_4$ is mixed with n-Propanol in a volume ratio of 1:1. To this mixture is added 1 mole of methacrylic acid ($H_2C=C(CH_3)COOH$), hereinafter referred to as MAA, by mole of $Zr(OPr)_4$ The resulting mixture is stirred for a period of 30 minutes.

In step 13, the mixture from step 11 is mixed with the mixture from step 12 to form a mixture containing MAPTMS and Zr(OPr)$_4$ in a molar ratio of 4:1. The resulting mixture is stirred for a period of 1 hour.

Step 14 consists of mixing the mixture from step 13 and deionized water (H$_2$O) to obtain a mixture in which the molar ratio R° of deionised water (H$_2$O) to Si and Zr alkoxides is 1.5.

In step 15, the mixture from step 4 is mixed with 1-hydroxycyclohexylphenylketone (C$_6$H$_5$COC$_6$H$_{10}$OH), hereinafter referred to as HCPK, to form a mixture containing Si and Zr alkoxides and HCPK in a molar ratio of 49:1. For example, HCPK is commercialized by the company CIBA under the trademark IRGACURE 184®. HCPK is introduced to photoinitiate the mixture from step 14.

Figure 2:
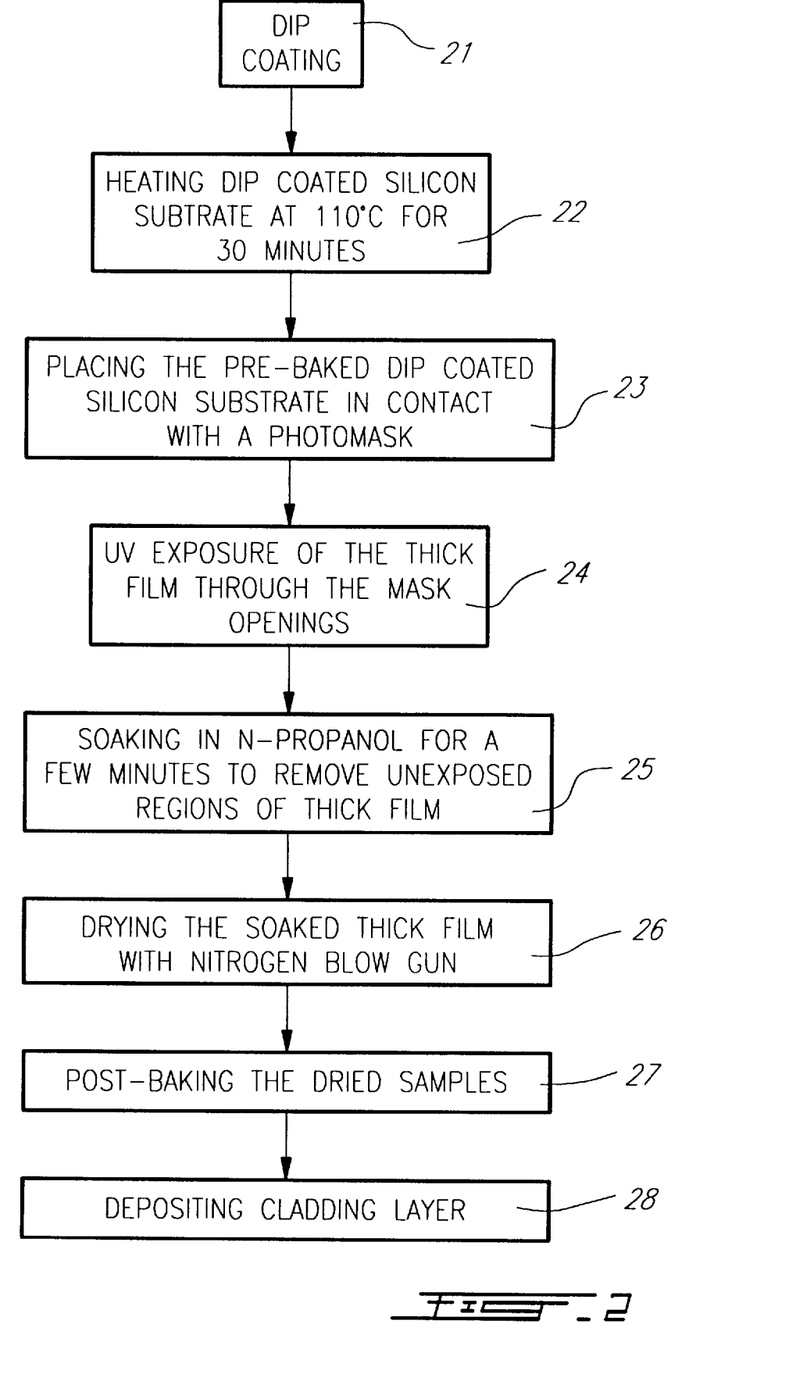
FIG. 2 is a flow chart depicting the various steps of a solvent-assisted lithographic process according to the present invention, using photosensitive sol-gel glass material for depositing a ridge waveguide on a semiconductor substrate.

In step 16, the sol-gel from step 15 is passed through a 0.2 μm filter, of the PTFE Gelman type, prior to the dip coating step (see step 21 of FIG. 2).

As illustrated in FIG. 1 in dashed line, the process of sol-gel production may further comprise optional step 17 consisting of adding zirconium(IV)-n-propoxide (Zr(OC$_3$H$_7$)$_4$) as a refractive index modifier. Those of ordinary skill in the art know that the introduction of a refractive index modifier can improve the performance or adjust the characteristics of ridge waveguides.

FIG. 2 is a schematic block diagram depicting the solvent-assisted lithographic deposition process used in Example 1.

In step 21, a thick film of sol-gel is dip coated on a silicon substrate. The dip coater was a conventional dip coating machine well known to those of ordinary skill in the art and housed in a plastic chamber purged with filtered air. A thick film of filtered sol-gel approximately 4 μm thick was deposited at a speed of 0.5 mm/s in one step onto the silicon substrate having thereon a 2 μm thermally grown SiO$_2$ buffer layer (<100> Si, NOVA Electronics, Inc.).

Following dip coating (step 21), the dip coated silicon substrate was immediately heated (pre-baked) at 110° C. in air in a conventional furnace for 30 minutes (step 22). Step 22 promotes solvent evaporation from the thick film. In addition, this heating hardens the film to prevent adhesion thereof to the mask during photoimprinting.

In step 23, the pre-baked dip coated thick film was placed in contact with a photomask deposited on a fused silica substrate (NTE Photomask). Channel waveguide, 1×8 beam splitter, and directional coupler mask patterns were used. The width of the channel waveguides ranged from 2 to 10 μm. The width of the splitter and directional coupler was 5 μm. The lengths of the channel waveguides, splitter and directional coupler were all 2.5 cm.

Step 24 is concerned with exposure of the thick film to ultraviolet (UV) light through the photomask to photoimprint the channel waveguides, splitter and directional coupler. A 100 W Hg lamp manufactured by the company Oriel was used for conducting this UV exposure through the mask openings, thereby photoimprinting the channel waveguides, splitter and directional coupler. This 100 W Hg lamp produced unfiltered UV light at a wavelength λ≦350 nm and an emittance≈14 W cm$^{-2}$. An exposure time of 30 minutes was sufficient to cause complete photopolymerisation of the vinyl monomer through the full thickness of the sol-gel thick film.

Following step 24, the exposed dip coated sol-gel film was soaked (step 25) in n-propanol for a few minutes to remove the unexposed regions of the sol-gel thick film. In step 26, drying was accomplished with nitrogen gas from a blow gun.

In step 27, the dried sample from step 26 was post-baked (heat cured for 30 minutes at 110° C. under a slowly flowing N$_2$ atmosphere. The temperature was then ramped to 200° C. at a rate of 0.5° C./min. The sample was then held at 200° C. for two hours before ramping down the temperature at the same rate of 0.5° C./min.

Figure 3:
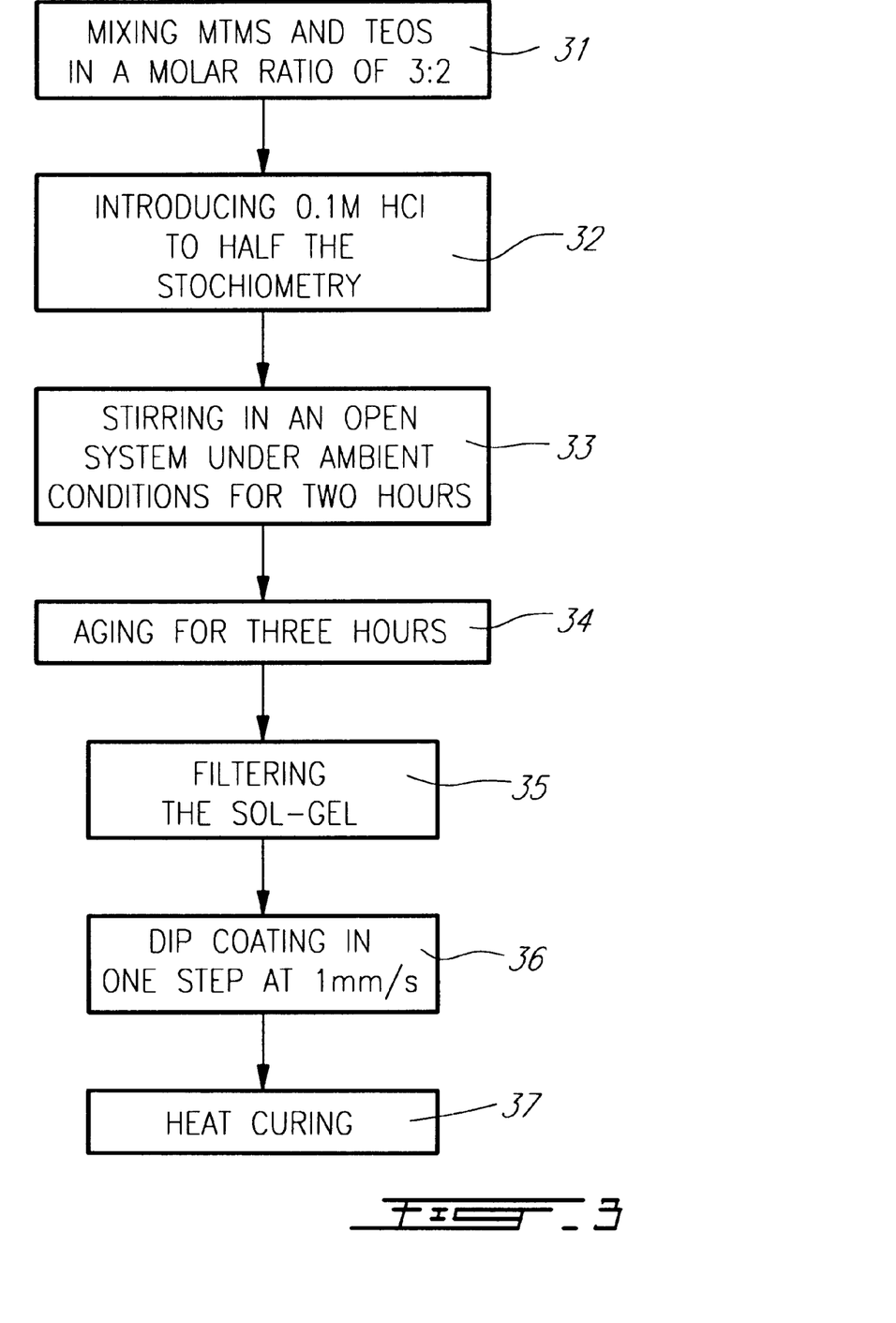
FIG. 3 is a flow chart depicting a process for coating a ridge waveguide obtained with the process of FIG. 2 with a cladding layer.

To protect the ridge waveguides, produce symmetric model fields, and reduce scattering, a cladding layer was deposited to bury the waveguide (step 28). Referring to FIG. 3, the sol-gel glass for the cladding layer was synthesized by mixing methyltrimethoxysilane (CH$_3$Si(OCH$_3$)$_3$, MTMS) and tetraethoxysilane (Si(OC$_2$H$_6$)$_4$, TEOS) in a molar ratio of 3:2 (step 31). H$_2$O as 0.1M HCl was introduced to half the stoichiometry required for complete hydrolysis (step 32). The solution was stirred in an open system under ambient conditions for two hours (step 33), and aged for three hours (step 34) before being filtered (step 35) and used. The cladding was dip-coated in one step at a speed of 1 mm/s (step 36). Finally, in step 37, the cladding was thermally treated (heat cured) for 30 minutes at 120° C. under a slowly flowing N$_2$ atmosphere. The temperature was then ramped to 200° C. at a rate of 0.5° C./min. The temperature of 200° C. was held for two hours before ramping down the temperature at the same rate of 0.5° C./min.

All the chemicals were of high purity and purchased from Aldrich Chemical Ltd., except MAPTMS and MTMS, which were purchased from United Chemical Technologies.

Qualitative Observations

Figure 4A:
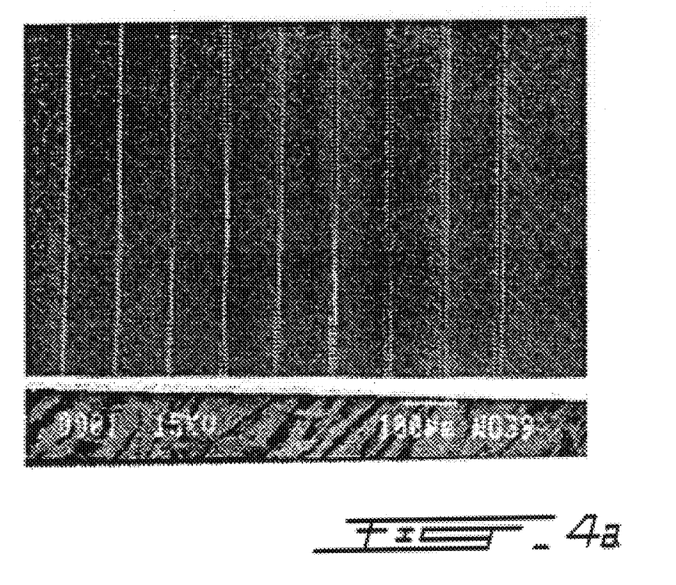
FIG. 4a is a SEM photograph of a typical ridge waveguide with nine channels ranging from 2 to 10 μm wide imprinted by ultraviolet (UV) light.
Figure 4B:
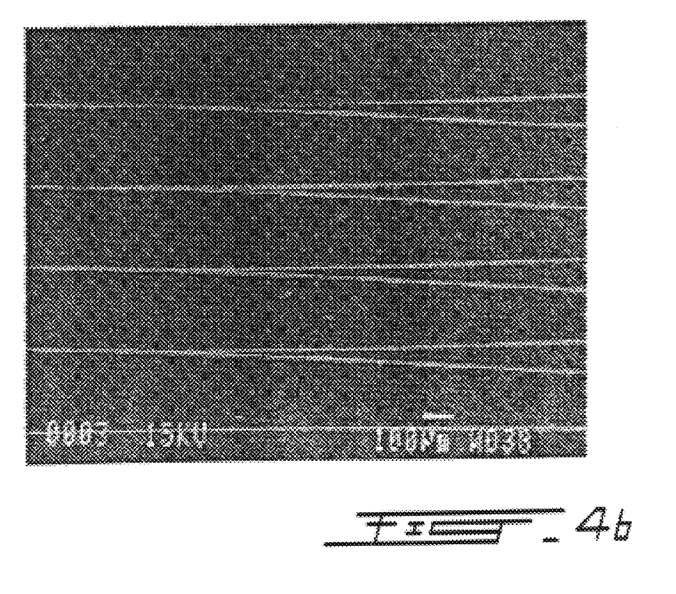
FIG. 4b is a SEM photograph of a typical 1×8 power splitter with channels 5 μm wide imprinted by UV light.
Figure 5A:
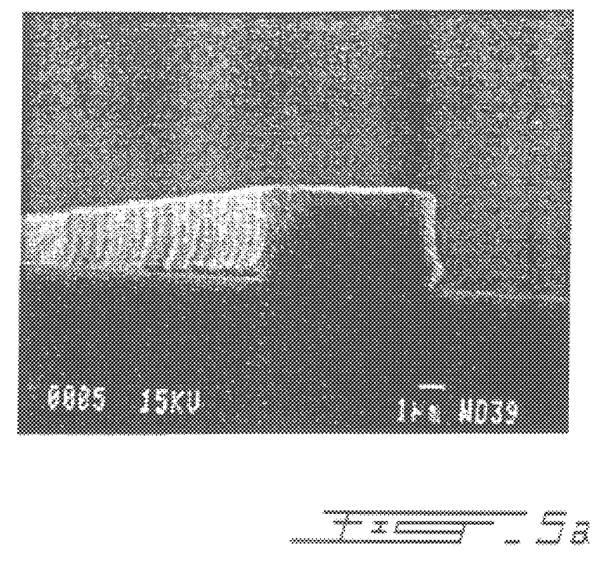
FIG. 5a is a SEM photograph of a typical exposed UV imprinted ridge waveguide.
Figure 5B:
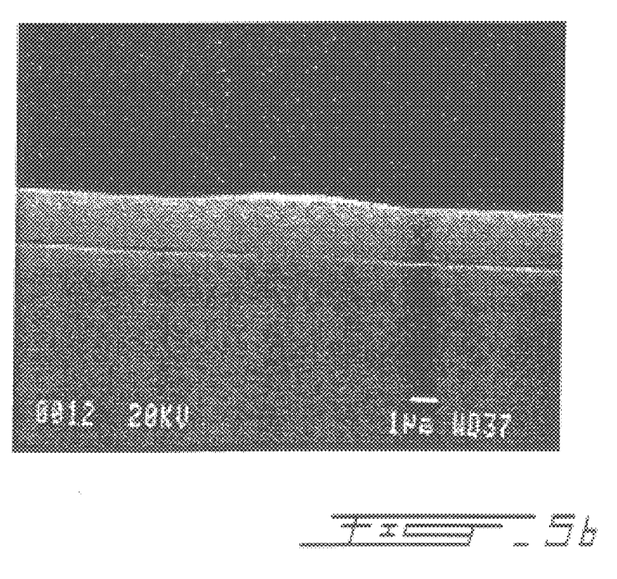
FIG. 5b is a SEM photograph of a typical buried UV imprinted ridge waveguide.

Qualitative examination of the structure of the photo-defined devices (channel waveguides, splitter and directional coupler) by optical microscopy and scanning electron microscopy (SEM, JEOL T300) was conducted. An approximately 350 nm Au/Pd film was sputter-deposited onto the ridge waveguides for the SEM examinations. SEM pictures of portions of a 9-channel waveguide and a 1×8 power splitter are shown in FIGS. 4a and 4b, respectively. FIGS. 4a and 4b show that all the channels are well-defined, with no visible defects. The reproducibility of the technique is very high. The very fine structure and fragile nature of the channels make them sensitive to handling and to scattering by particle inclusions; for that reason the fabrication process is best done in a clean room. FIGS. 5a and 5b show SEM photographs of an unburied and a buried ridge channel waveguide, respectively. The mask opening for the exposed channel was 7 μm, which corresponds to the width of the feature observed by SEM. Faithful reproduction of the mask dimensions constitutes another advantage of this photoinscription densification technique. It can be observed that there are slight corrugations in the wall surfaces of the unburied waveguide channel (FIG. 5a). Loss measurements show that the sidewall roughness does not contribute significant optical loss. The roughness may be due to nonuniformity in the spatial deposition of the polymerization of species during photoinscription. Two small cusps can be observed that run the length of the base on both sides of the channel. These features might be caused by shrinkage during post-baking. The profile in FIG. 5b shows that the ridge is almost planarized by the cladding layer, which is symmetrical on either side of it. Complete coverage in this manner improves the circularity of the waveguide modes and therefore the coupling efficiency to the fiber systems. The SEM was almost blind to the buried ridges, even in the backscattered image mode.

Thickness and Refractive Index

A Sloan DekTak 3030ST auto-leveling profilometer with a precision of ±2 nm was used to determine the thickness of the films and the elevation of the ridge waveguides. Refractive indices were measured by ellipsometry (Gaertner) at a wavelength of 0.633 μm. The precision in the refractive index was ±0.005 over most measurement ranges. Ellipsometry was conducted on films of approximately 0.1 μm thickness. These films were prepared from five fold dilutions of sol-gels with n-propanol prior to dip coating. The thin films prepared from the photosensitive sol-gels were then pre-baked at 110° C. for 30 minutes, followed by UV exposure (without using the masks) for a few minutes. They were then heated at 200° C. in $N_2$ for 30 minutes. Thin films derived form MTMS/TEOS were baked directly at 200° C. in air for 30 minutes.

The study of a number of ridge waveguides and MTMS/TEOS cladding layers after heat treatment at 200° C. revealed that the fabrication process produces ridge waveguides between 3 and 4 μm high. Cladding layers were approximately 2.5 μm thick, depending on the ambient processing conditions including sol-gel aging time. A typical result is given in FIGS. 5a and 5b. FIG. 5a shows a 4×7 μm (height×width) ridge waveguide, and FIG. 5b a 2.4 μm thick cladding layer on a 3×3 μm buried ridge waveguide. The refractive indices of thin films, extrapolated to the ridge waveguides and the cladding layers, were found to be ≈1.52 and 1.42, respectively. These should be regarded as lower limits. As described below in the mode profile section, the circular symmetry of the mode measured for the buried ridge waveguides indicates a refractive index higher than 1.42 for the cladding layer.

Mode Profile

For mode coupling, a number of channel waveguides were examined at 1.55 μm wavelength using an erbium doped fiber laser (EFL-R98-T). To make them more convenient for evaluation, the waveguides were first cleaved on either end using a diamond pen. The exposed edges required no additional polishing. Light from a monomode fiber was coupled into one channel at a time. Every channel ranging from 2 to 10 μm wide and 3 to 4 μm high was able to guide the light.

Figure 6A:
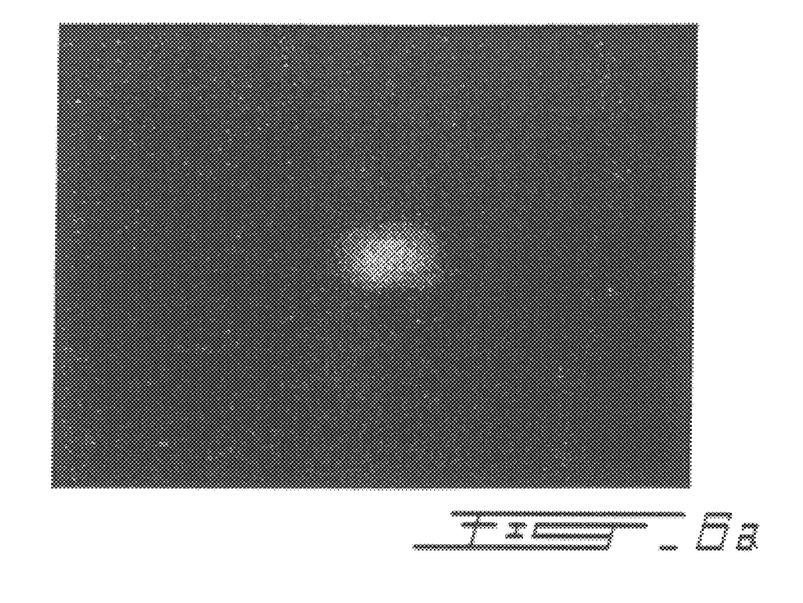
FIGS. 6a and 6b are measured mode profiles of a 6×3 μm exposed UV imprinted ridge waveguide at $\lambda$=1.55 μm, with their corresponding model field intensity distributions; simulated mode profile intensity was obtained by finite difference method and normalized contours of intensity 0.2, 0.4 and 0.8 are indicated.
Figure 6B:
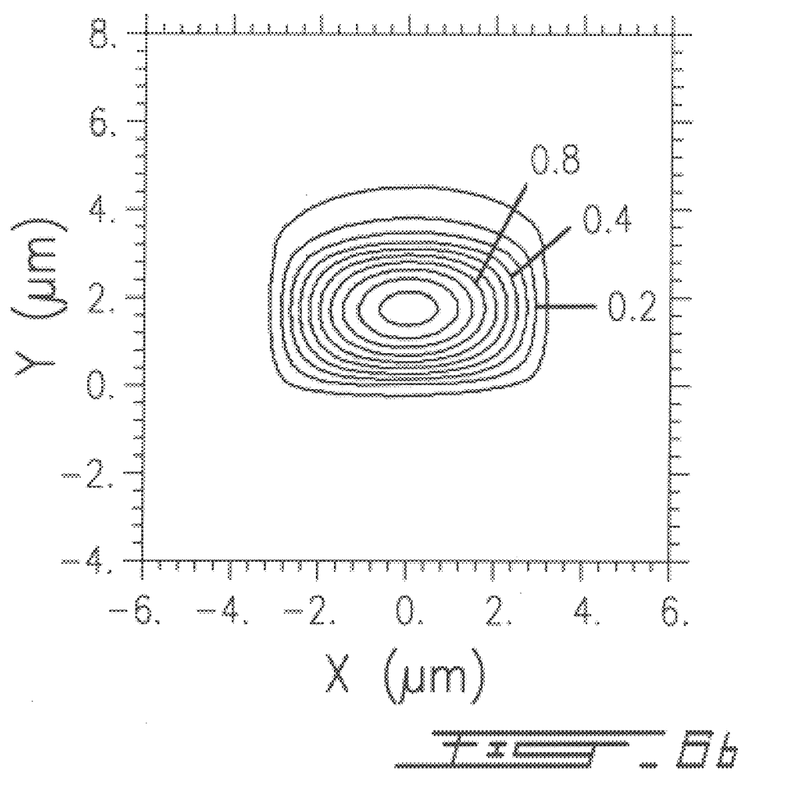

Mode profiles of the channel waveguides were collected from the output ports of the channels by a 25×/0.6 objective and focused onto a camera equipped with an infrared detector interfaced to a monitor (JVC). The mode profile study revealed that the 2 to 6 μm wide guides supported one mode, whereas two modes were supported in the 10 μm wide guides. FIGS. 6a and 6b show photographs of two guided modes in a 6×3 μm unburied and a 5×3 μm buried waveguides, together with their simulated field intensity distribution. Simulations were carried out using Optonex software by Optonex Ltd, Helsinki, Finland, which is based on the finite-difference method. FIG. 6b clearly shows the effect of the cladding on the profile of the guided mode as compared to the unburied waveguide. The circularity of this mode confirms that this approach to ridge waveguide fabrication is attractive for high coupling efficiency to optical fiber systems.

Propagation Loss

Figure 7:
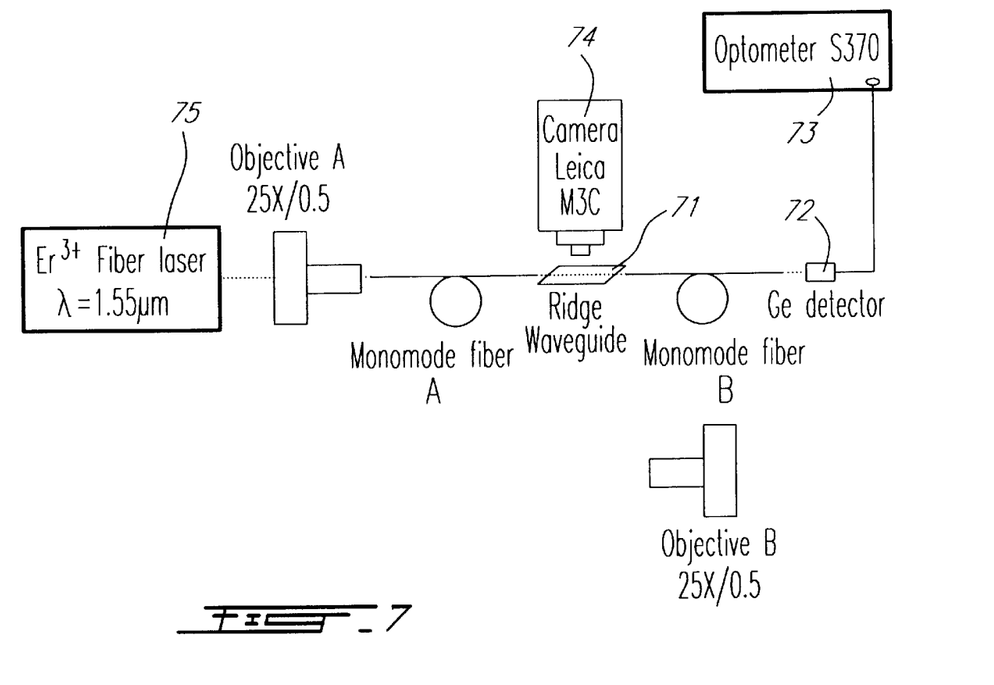
FIG. 7 is a schematic block diagram of a setup for the measurement of propagation loss in ridge waveguides.
Figure 8:
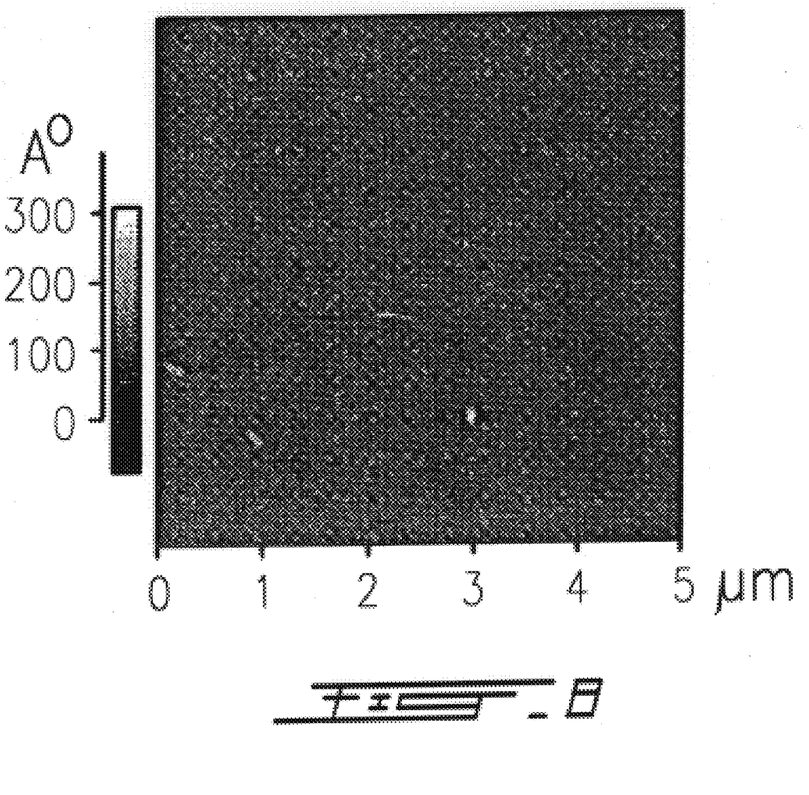
FIG. 8 is an AFM (Atomic Force Microscope) image of an exposed UV imprinted ridge waveguide, this image covering 25 μm$^2$ of the top surface of the ridge waveguide.
Figure 8C:
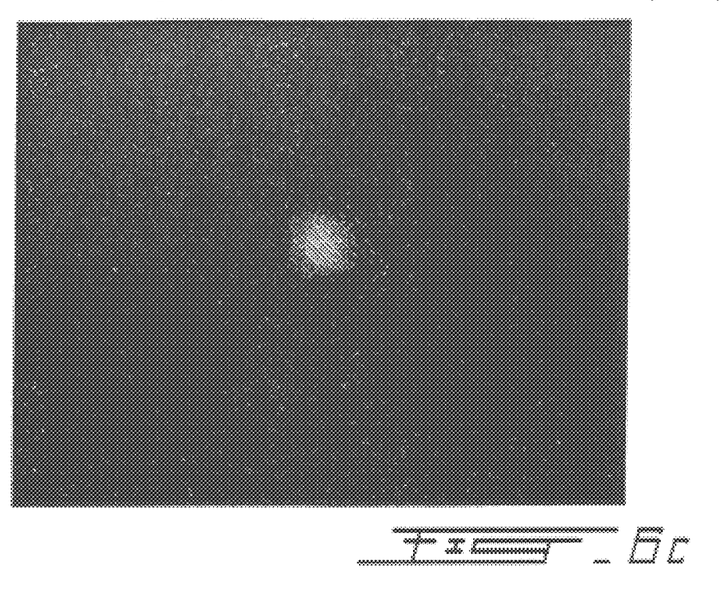
Figure 8D:
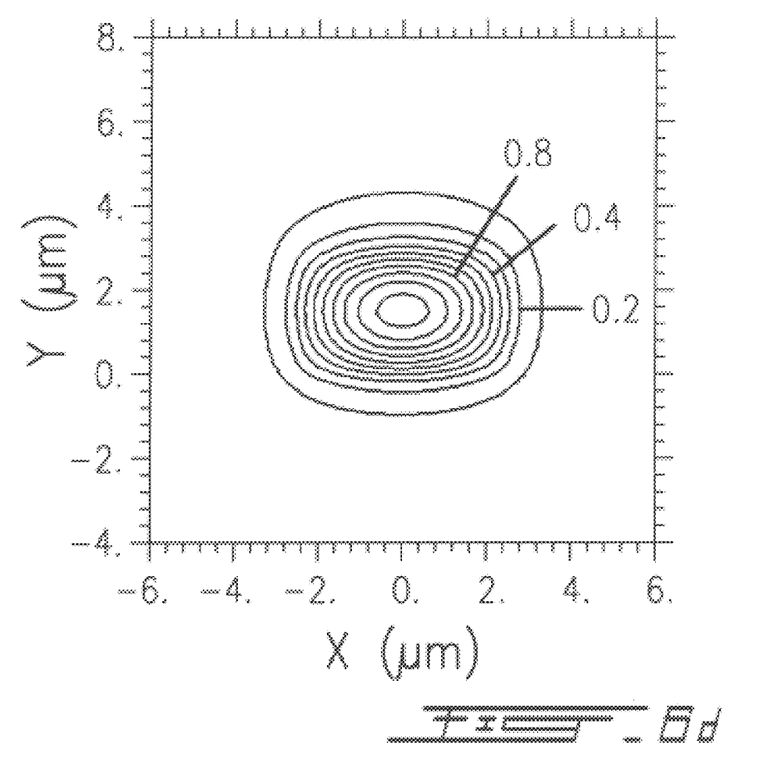

Loss in the waveguides was quantified by the fibre end-coupling technique (M. Mennig, G. Jonschker, and H. Schmidt, "*Sol-gel derived thick coatings and their thermo-mechanical and optical properties*", Sol-Gel Optics II, J. D. Mackenzie, ed., Proc. SPIE, 1758, 125–134 (1992)) which measures the attenuation of light in several single mode channels (≈1.5 cm in length) at a wavelength of 1.55 μm. The propagation loss, $\alpha_p$, in dB/cm was determined by utilizing the following equation (W. J. Wang, S. Honkanen, and S. I. Najafi, "Loss characteristics of potassium and silver double-ion exchanged glass waveguides", J. Appl. Phy. 74, 1529–1533 (1993)):

$$\alpha_p = -10\log\left(1 - \frac{I_2^2 T_f}{I_1 I_3 T_o^2}\right)$$

where $T_f$ (≈0.96) is the fiber A transmission, and $T_o$ (≈0.8) is the objective B transmission. A diagram of the setup used for loss measurement is shown in FIG. 7. First, light at a wavelength λ=1.55 μm from fiber laser 75 objective A was coupled into and out of the ridge waveguide 71 via two monomode fibers A and B. The output of the fiber B, was focused onto a germanium detector 72 and the intensity of light, $I_1$, was measured by a digital optometer 73. The measurement of $I_1$ assumes that the input and output coupling losses are the same (W. J. Wang, S. Honkanen, and S. I. Najafi, "Loss characteristics of potassium and silver double-ion exchanged glass waveguides", J. Appl. Phy. 74, 1529–1533 (1993)). This was checked by reversing the waveguide and repeating the measurement. In a subsequent step, fiber B was replaced by objective B without disturbing fiber A, the ridge waveguide 71 and the detector 72. Objective B collected the coupled light from the output port of the channel and directed it onto the detector 72. In this way the intensity, $I_2$, was measured. Stray light from the substrate was excluded by leaving sufficient distance between the objective B and the detector 72. The measurement was repeated again to determine $I_3$. In this case, the waveguide 71 was removed and light from fiber A was collected directly via objective B. A microscopic camera (Leica M3C) 74 was used for the coupling and alignments. An evaluation of several single mode channel waveguides gave an average for the propagation loss of 0.13 dB/cm. Given that rigorous clean room conditions were not used during the fabrication process, the measured loss is very good. An examination of the waveguide surface topography by atomic force microscopy (PC AFM) showed that the devices were very smooth, with a roughness on the order of 10 nm. Note, however, the presence of a minute particle located near the 3 μm scale position in FIG. 8.

Therefore, it has been demonstrated that passive ridge waveguides can be deposited on silicon by a solvent-assisted lithographic process utilizing simple mask technology and photosensitive-sol gel derived glasses. The procedure is simple, and reproducible, and leads to low loss devices. The sol-gel chemistry can be extended to planarize ridges with a cladding. The circularity of mode profiles in the ridge waveguides makes them attractive for high coupling efficiency in optical fiber communications systems.

EXAMPLE 2

The ridge waveguide fabricating process according to the present invention can also be adapted to fabricate ridge waveguides with a sol-gel composition formulated by combining methacryloxypropyltrimethoxysilane ($H_2C=C(CH_3)CO_2(CH_2)_3Si(OCH_3)_3$), MAPTMS) and bis(s-butoxy)aluminoxytriethoxysilane specifically in the ratio 80 molepercent methacryloxypropyltrimethoxysilane and 20 molepercent bis(s-butoxy)aluminoxytriethoxysilane, using 1.5 equivalent of acidified (HCl) water (molar ratio of the mixture of methacryloxypropyltrimethoxysilane and bis(s-butoxy)aluminoxytriethoxysilane to acidified (HCl) water equal to 1.5).

The fabrication process according to the invention presents, amongst others, the following advantages over the other photoinscription techniques in photosensitive, organically modified glasses such as for example laser writing and ablation:

a) precise definition of boundaries in ridge waveguides;
b) simplification of geometrical and material schemes for matching field overlap between glass fiber and device/component;
c) omission of expensive laser ablation steps, reactive ion etching equipment (and attendant multi-step processing);
d) faster turnaround time for testing ridge waveguides;
e) lower temperature fabrication; and
f) lower capital investment and capital infrastructure support for the present process.

Finally, it should be mentioned that in the present disclosure and the appended claims, the term "sol-gel" is intended to designate the substance prepared as taught in Examples 1 and 2 as well as any other substance having similar characteristics and/or functional equivalence as known to those of ordinary skill in the art.

Although the present invention has been described hereinabove by way of a preferred embodiment thereof, this embodiment can be modified at will, within the scope of the appended claims, without departing from the spirit and nature of the subject invention.

What is claimed is:

1. A process for fabricating a ridge waveguide on a substrate, comprising:

producing a film of photosensitive sol-gel wave-propagating material on at least a portion of the substrate;

applying a photomask to the film of photosensitive sol-gel wave-propagating material, the photomask having at least one opening outlining the ridge waveguide;

exposing a portion of the film of photosensitive sol-gel wave-propagating material to ultraviolet radiation through said at least one opening of the photomask to render said portion of the film insoluble to a given solvent through the full thickness of said film and to imprint the ridge waveguide in said film; and dissolving the unexposed portion of the film of photosensitive sol-gel wavepropagating material by means of said solvent to leave on the substrate the exposed film portion and therefore the ridge waveguide.

2. The process of claim 1, further comprising heat curing the ridge waveguide after the unexposed portion of the film of photosensitive sol-gel wave-propagating material has been dissolved by means of the solvent.

3. The process of claim 2, further comprising covering the heat cured ridge waveguide with a cladding layer.

4. The process of claim 2, wherein heat curing the ridge waveguide comprises post-baking the ridge waveguide within a range of temperatures having a lower temperature limit and an upper temperature limit equal to 200° C.

5. The process of claim 3, wherein covering the heat cured ridge waveguide with a cladding layer comprises:

dip coating a layer of sol-gel glass material over the ridge waveguide; and heat curing the layer of sol-gel glass material within a range of temperatures having a lower temperature limit and an upper temperature limit equal to 200° C.

6. The process of claim 5, wherein covering the heat cured ridge waveguide with a cladding layer comprises synthesizing the sol-gel glass material by mixing methyltrimethoxysilane and tetraethoxysilane in a molar ratio of 3:2.

7. The process of claim 1, further comprising, prior to producing the film of photosensitive sol-gel wave-propagating material, preparing a photosensitive sol-gel glass material constituting said photosensitive sol-gel wave-propagating material.

8. The process of claim 7, wherein the substrate is a semiconductor substrate and wherein preparing the photosensitive sol-gel glass material comprises mixing methacryloxypropyltrimethoxysilane with methacrylic acid.

9. The process of claim 7, wherein the substrate is a semiconductor substrate and wherein preparing the photosensitive sol-gel glass material comprises mixing methacryloxypropyltrimethoxysilane with bis(sbutoxy) aluminoxytriethoxysilane.

10. The process of claim 7, wherein the substrate is a silicon substrate, and wherein the step of preparing the photosensitive sol-gel glass material comprises:

mixing methacryloxypropyltrimethoxysilane with 0.01 M HCl in a molar ratio of 1:0.75 to produce a first mixture;

mixing Zr(OPr)4 with n-Propanol in a volume ratio of 1:1 to produce a second mixture, and adding to said second mixture 1 mole of methacrylic acid by mole of Zr(OPr)4 to produce a third mixture;

mixing the first and third mixtures to produce a fourth mixture containing methacryloxypropyltrimethoxysilane and Zr(OPr)4 in a molar ratio of 4:1;

mixing the fourth mixture and deionized water to obtain a fifth mixture in which the molar ratio of deionized water to Si and Zr alkoxides is 1.5–1;

mixing the fifth mixture with 1-hydroxycyclohexylphenylketone to produce a sixth mixture containing Si/Zr alkoxides and 1-hydroxycyclohexylphenylketone in a molar ratio of 49–1, said sixth mixture constituting the photosensitive sol-gel glass material.

11. The process of claim 10, wherein preparing a photosensitive sol-gel glass material further comprises filtering the sixth mixture to obtain a filtered photosensitive sol-gel glass material.

12. The process of claim 10, wherein preparing the photosensitive sol-gel glass material comprises adding zirconium(IV)-n-propoxide as a refractive index modifier in the sixth mixture.

13. The process of claim 10, wherein producing the film of photosensitive sol-gel wave-propagating material comprises dip coating a thick film of photosensitive sol-gel glass material on the silicon substrate, and pre-baking said dip coated thick film.

14. The process of claim 10, wherein exposing said portion of the film to ultraviolet radiation comprises exposing the photosensitive sol-gel glass material through said at least one opening of the photomask to an ultraviolet light at a wavelength k less than or equal to 350 nm and an emittance of about 14 W cm$^{-2}$.

15. The process of claim 10, wherein dissolving the unexposed portion of the film comprises soaking the film of photosensitive sol-gel glass material in n-propanol.

16. The process of claim 10, further comprising heat curing the ridge waveguide, said heat curing of the ridge waveguide including:

post-baking the ridge waveguide for a first given period of time at a first predetermined temperature under a gaseous atmosphere; ramping the temperature at a first given rate from the first predetermined temperature to a second predetermined temperature higher than the first predetermined temperature; and holding the second predetermined temperature for a second given period of time; and ramping down the temperature at a second given rate;

wherein the temperature is always less than or equal to 200° C.

17. The process of claim 1, in which producing the film of photosensitive sol-gel wave-propagating material comprises dip coating a thick film of photosensitive sol-gel wave-propagating material on the substrate.

* * * * *